United States Patent [19]

Sano et al.

[11] Patent Number: 5,115,812
[45] Date of Patent: May 26, 1992

[54] MAGNETIC RESONANCE IMAGING METHOD FOR MOVING OBJECT

[75] Inventors: Koichi Sano; Akira Maeda, both of Sagamihara; Tetsuo Yokoyama, Tokyo; Hideaki Koizumi, Katsuta, all of Japan

[73] Assignee: Hitachi, Ltd., Tokyo, Japan

[21] Appl. No.: 441,972

[22] Filed: Nov. 28, 1989

[30] Foreign Application Priority Data

Nov. 30, 1988 [JP] Japan ............................. 63-300490
Sep. 4, 1989 [JP] Japan ............................. 1-227364

[51] Int. Cl.$^5$ ............................................. A61B 5/055
[52] U.S. Cl. ................... 128/653.2; 324/306; 324/309; 128/653.3
[58] Field of Search ............ 128/653 AF, 653 A; 324/306, 307, 309

[56] References Cited

U.S. PATENT DOCUMENTS

| | | | |
|---|---|---|---|
| 4,730,620 | 3/1988 | Bailes | 128/653 A |
| 4,752,735 | 6/1988 | Onodera et al. | 324/309 |
| 4,777,957 | 10/1988 | Wehrli et al. | 324/309 |
| 4,796,635 | 1/1989 | Dumoulin | 324/309 |
| 4,825,159 | 4/1989 | Oppelt et al. | 324/309 |
| 4,849,697 | 7/1989 | Cline et al. | 324/306 |
| 4,891,595 | 1/1990 | Granot | 324/309 |
| 4,893,081 | 1/1990 | Zur | 324/309 |
| 4,978,918 | 12/1990 | Sakamoto | 324/309 |

FOREIGN PATENT DOCUMENTS 0301629 2/1989 European Pat. Off.
0349231 1/1990 European Pat. Off.

*Primary Examiner*—Lee S. Cohen
*Assistant Examiner*—Krista M. Pfaffle
*Attorney, Agent, or Firm*—Antonelli, Terry, Stout & Kraus

[57] ABSTRACT

To obtain a high quality image at a vascular area at high speed: (1) there is used a pulse sequence which includes a bipolar phase encoding magnetic field, dephases a stationary area, and does not generate the first order moment; (2) phase distortions are estimated from measured data and removed, without incorporating a new function for function fitting; and (3) the relationship between the application timing of a readout gradient magnetic field and the latest application time of the other slice selection and phase encoding magnetic fields is obtained using as its parameter the time $T_E$ from excitation to generation of an echo peak within a measurement signal, and using this relationship, the application timing $T_E$ is obtained which makes minimum the echo peak shift quantity.

9 Claims, 10 Drawing Sheets

FIG. 6
FIG. 7
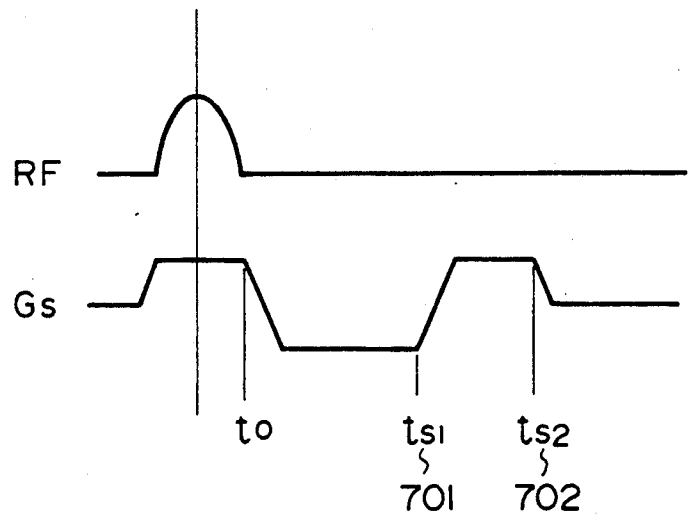
FIG. 8
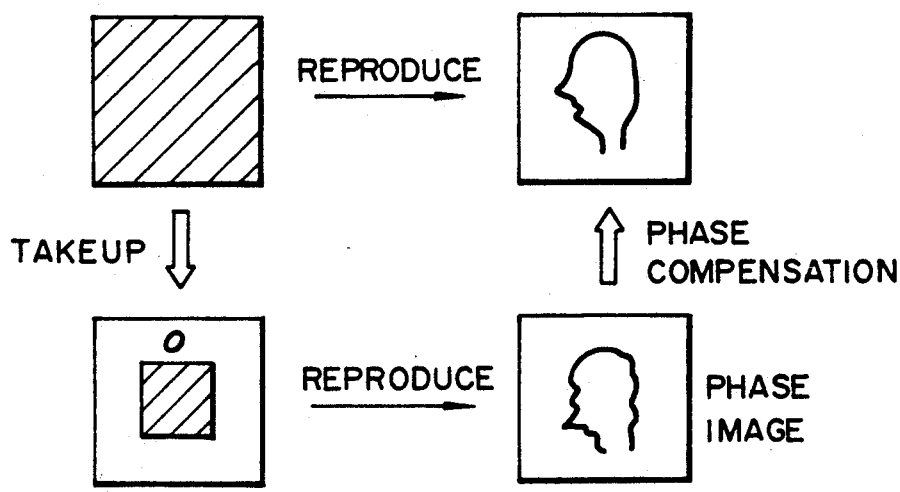

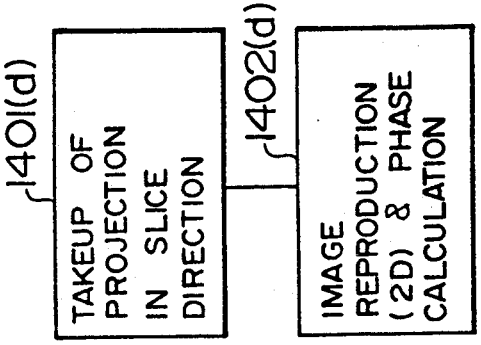
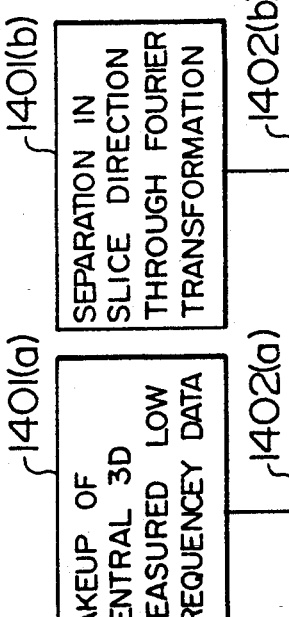
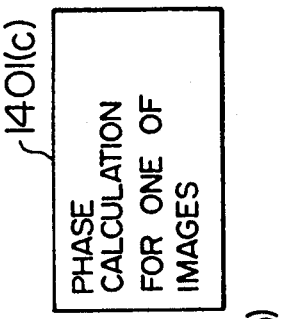

//MAGNETIC RESONANCE IMAGING METHOD FOR MOVING OBJECT

BACKGROUND OF THE INVENTION

The present invention relates to a magnetic resonance imaging (MRI) method using nuclear magnetic resonance phenomenon for obtaining a tomogram, and more particularly to such an imaging method capable of effectively imaging a moving object such as blood vessels, cerebro-spinal fluid (CSF), heart and the like.

Relevant arts to this invention are the following five documents (1) to (5).
(1) IEEE, Trans. on Medical Imaging, MI-1, No. 3, pp. 140-151, 1986
(2) Japanese Journal of Magnetic Resonance in Medicine, Vol. 8 Supplement-1, p. 236, 1988
(3) Radiology, Vol. 161, No. 3, pp. 717-720, 1986
(4) Society of Magnetic Resonance in Medicine (SMRM), Book of Abstracts, Vol. 1, p. 29, p. 446, 1987
(5) Japanese Patent Laid-open Publication No. 01-131649

A method of magnetic resonance imaging for a moving object (mainly vascular areas) is detailed in the document (1).

According to the principle of selecting vascular areas, a pulse called a flow encoding pulse is used which generates a phase change in accordance with motion. If the flow encoding pulse is present in the flow direction, there is generated a phase change corresponding in amount to the flow rate. Subtraction is then performed between images by a phase sensitive sequence including the flow encoding pulse and a phase insensitive sequence. Since the flow within a vessel is a laminar flow, the vascular area imaged with the phase sensitive sequence has a phase which changes from the center to the periphery of a vessel. Integrated projection data cancel each other so that no signal is obtained from the vascular area. In addition, with the phase insensitive sequence, the phase does not change with motion so that signals are obtained from a laminar vascular area. The stationary area provides signals for both the sequences. The stationary area disappears upon subtraction of images obtained from both sequences, and there appears only the vascular area obtained from subtraction between images. This method is called a subtraction method.

The x-, y- and z-directions in the coordinate system are hereinafter called the readout, phase encoding, and slice directions which are commonly used in this art. FIGS. 4A and 4B shown examples of timing charts of gradient magnetic fields applied in these directions in the subtraction method. FIG. 4A shows the phase insensitive sequence, and FIG. 4B shows the phase sensitive sequence. The sequences shown in FIGS. 4A and 4B are called pulse sequences which are depicted therein as used for one measurement. In the sequences shown, RF and Signal represent the timing of applying a high frequency magnetic filed generated by an RF generator shown in FIG. 3, and the timing of a measured signal. Gs, Gp and Gr represent the timings of gradient magnetic fields respectively in the slice, phase encoding and readout directions.

In the phase sensitive sequence shown in FIG. 4B, first there are applied at the same time a high frequency magnetic field 401 for declining nuclear spins by α degree and a gradient magnetic field 402 in the slice direction for selective excitation of spins within a slice. Next, there is applied an inverted gradient magnetic filed 403 in the slice direction for alignment of selectively excited spins. Then there is applied a phase encoding pulse 404 to add the information for discriminating the position in the phase encoding direction. At the same time, there is applied an inverted gradient magnetic field 405 in the slice direction for formation of a gradient echo. Thereafter, a gradient magnetic field 406 in the readout direction is applied to measure an echo signal 407. The above operations are repeated at a predetermined repetition frequency (TR) while changing the intensity of the phase encoding pulse 404. In general, the gradient magnetic field (phase encoding pulse 404) in the phase encoding direction is changed 256 times to obtain two-dimensional measurement data necessary for image reproduction. The phase encoding pulse may be changed either starting from a low intensity or from a high intensity.

In contrast, in the case of the phase insensitive sequence shown in FIG. 4A, there are two different points from FIG. 4B. One is that the magnetic fields 402 and 403 serve as the flow encoding magnetic fields in the slice direction in FIG. 4B, whereas in FIG. 4A magnetic fields 408 and 409 are used to make insensitive the phase in the slice direction. The other is that the readout magnetic fields 405 and 406 also serve as the flow encoding magnetic fields in FIG. 4B, whereas in FIG. 4A magnetic fields 410, 411 and 412 are used to make the phase insensitive in the readout direction.

In the angiography using these sequences, there have been proposed the methods of improving the image quality, including (1) a sensitive improvement method in the phase encoding direction, (2) a stationary area signal suppression method of a slice selection type, and (3) a reproduced image phase compensation method.

The description is first directed to the sensitivity improvement method in the phase encoding direction.

Conventionally, as shown in the phase sensitive and insensitive sequences of FIGS. 4A and 4B, any new gradient magnetic field has not been added in the phase encoding direction. The reason for this is that when imaging is carried out at the blood flow rate timings in synchro with a cardiogram, the phase encoding pulses do not disturb the blood phase within a vessel but only generate positional displacement, thus posing no practical problem. However, in the case of the latest high speed imaging wherein imaging is carried out asynchronously, the phase encoding pulses disturb the blood phase so that the blood phase change should be compensated. In the document (3), a compensation method is discussed wherein in addition to the necessary phase encoding pulse, three additional phase compensation pulses are applied.

Next, the stationary area signal suppressing method of the slice selection type will be described.

In the angiography, images projected in the slice direction are picked up. Picked-up images for both the phase insensitive and sensitive sequences have the stationary area in which signals from fine vessels are included. Therefore, most of the dynamic range of measured signals is occupied by the stationary area, thereby posing a problem that essential signals from vascular areas cannot be amplified sufficiently. A means for solving this has been proposed in the document (3) wherein an additional gradient magnetic field (dephasing magnetic field) is applied in the slice direction to disturb the phase at the stationary area and make small those signals therefrom, thereby making relatively large the signals from the vascular area.

There has also been proposed an image quality improvement method not in the imaging level but in the image reproduction level. In the subtraction between two images, since the values of reproduced images have complex numbers, the subtraction should be carried out by using complex numbers. However, the conventional subtraction has used the absolute values of images for the convenience purpose. The reason for this is that since the phase change occurs not only from the blood flow but also from the distortion of the apparatus and from the switching of magnetic fields, the influence of such distortion and switching is required to be eliminated. In the above-described subtraction, pixels having different comlex numbers may have the same absolute value so that a void in the vascular area may occur. A measure for solving this has been proposed in the document (4) at page 29 wherein the phase difference between two images is subjected to a function fitting in consideration of a gentle phase difference therebetween.

As stated above, in the sensitivity improvement method in the phase encoding direction as of the document (2), three additional encoding pulses as well as the essential phase encoding pulse are used. The time from excitation to measurement accordingly becomes substantially longer so that the rapid flow rate such as in the artery cannot be regarded as a constant rate. There arises therefore another problem that a phase change occurs even in the case of the phase insensitive sequence which otherwise does not generate a phase change (1st Problem).

In the stationary area signal suppression method of the slice selection type as of the document (3), an additional dephasing magnetic field generates the first order moment although signals from the stationary area are reduced by the dephasing magnetic field. From this reason, if there is any motion in the slice direction, the phase is disturbed even by the phase insensitive sequence, thereby posing a problem that signals from the vascular area become not likely to be picked up (2nd Problem).

In the reproduced image phase compensation method as described at page 29 of the document (4), not only the function fitting requires an additional operation time, but also the compensation results are dependent on the type of function fitting (3rd Problem)

Further, the last processed vascular images have been displayed merely as a monochrome image so that discriminating between arteries and veins has not been possible (4th Problem).

The conventional methods of improving the image quality of the vascular area have been associated with several problems as above. Image quality could not always be improved by these conventional methods.

SUMMARY OF THE INVENTION

It is a first object of the present invention to solve the above first to fourth problems, and provide a moving object imaging method capable of obtaining a vascular area image of high quality, by (1) clearly imaging the vascular area and by (2) displaying distinguishably arteries and veins.

To deal with the first problem of a longer echo time from excitation to measurement in the phase encoding direction, a sequence with a minimum echo time is used wherein conventional additional three phase encoding pulses are reduced to one pulse.

To deal with the second problem of generating the first order moment because of the dephasing magnetic field, a sequence is used which can dephase the stationary area and does not generate the first order moment.

To deal with the third problem of the function fitting, a process of removing phase distortion is used wherein without incorporating a new function, the phase distortion included in the measured data is estimated from measured data per se.

To deal with the fourth problem as to the separated display of arteries and veins, the arteries and veins are discriminated on the basis of the phase of a reproduced image.

BRIEF DESCRIPTION OF THE DRAWINGS

FIG. 6 shows an example of a flow encoding pulse;

FIG. 7 shows a principal configuration of a flow encoding pulse in the slice direction;

FIG. 8 is a conceptual diagram illustrating the method of compensating a phase according to the present invention;

FIG. 13 is a flow chart showing the phase distortion estimation procedure for two-dimensional imaging;

FIGS. 14(a) to 14(d) are flow charts showing the phase distortion estimation procedure for three-dimensional imaging;

DETAILED DESCRIPTION OF THE PREFERRED EMBODIMENTS

The principle of the present invention will be described first.

A phase change upon application of a gradient magnetic field is generally expressed by:

$$\phi(t) = \gamma \int G(\tau) S(\tau) d\tau \qquad (1)$$

where $\gamma$ is a nuclear magnetic rotation ratio, G is an applied gradient magnetic field, and S is a position of a spin.

The position S of a spin is expressed in the following equation while taking into consideration up to the primary speed of a spin as the motion of the spin:

$$S(t) = x_0 + vt \quad r \qquad (2)$$

Substituting the equation (2) into (1), it becomes:

$$\begin{aligned}\phi(t) &= \gamma x_0 \int G(\tau)d\tau + \gamma V \int G(\tau)d\tau \\ &= \gamma x_0 M_0 + \gamma v M_1\end{aligned} \qquad (3)$$

where $M_0$ is a 0-th order moment, and $M_1$ is a first order moment. The 0-th order moment is an area of the applied magnetic field and indicates the magnitude of phase change given to a stationary spin. The first order moment, on the other hand, indicates a factor or proportionality of phase change of a moving spin relative to its velocity v which is not zero.

The description will be directed first to the improvement on the sensitivity in the phase encoding direction.

Figure 5A:
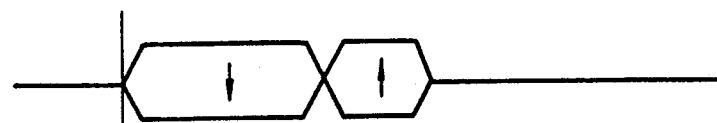
FIGS. 5(a) through 5(f) show a phase insensitive sequence and various phase sensitive sequence according to the present invention.

Improving the sensitivity is to design a phase encoding magnetic field which does not generate the first order moment so as to be irrelevant to spin speed. A general phase encoding magnetic field is shown in FIG. 5(d). In the phase encoding, the first order moment $M_1$ changes at each measurement. As apparent from the equation (3), both the 0-th and first order moments are not zero.

In order to make the first order moment zero while making the 0-th order moment constant, a magnetic field should be used which suffices the conditions of:

$$M_0' = 0, \ M_1' \neq -M_1 \qquad (4)$$

Conventionally, three magnetic fields have been used to make zero the 0-th order moment $M_0$. There is known a flow encoding magnetic field, such as shown in FIG. 6, which suffices the equation (4). The phase encoding magnetic field sufficing the equation (4) is therefore obtained as shown in FIG. 5(a) in the combined form of the phase encoding magnetic field and flow encoding magnetic field. This phase encoding magnetic field shown in FIG. 5(a) is a combination of two inverted phase encoding magnetic fields so that it is called a bipolar encoding magnetic field hereinafter where applicable. By using this bipolar encoding magnetic field, phase insensitive sequences can be realized which makes the first order moment zero in the phase encoding direction.

A difference between phase insensitive and sensitive imagings is used in angiography to obtain vascular morphology. There are shown, in FIGS. 5(b) to 5(f), examples of an encoding magnetic field used for phase sensitive sequences wherein the phase change is obtained from the motion in the phase encoding direction and no signal is generated from vessels.

Figure 5B:

In the example shown in FIG. 5(b), a flow encoding magnetic field is additionally applied after the phase insensitive encoding magnetic field to thereby obtain a flow sensitivity. The flow encoding magnetic field may be added in front of the phase insensitive encoding magnetic field.

Figure 5C:
Figure 5D:
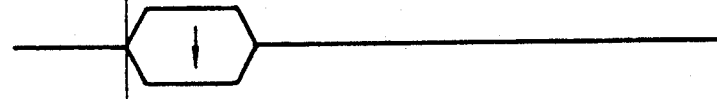

FIG. 5(c) shows a modification of FIG. 5(b). In this modified example, the flow encoding magnetic field is divisionally used before and after the phase insensitive encoding magnetic field, to thereby obtain a flow sensitivity greater than that of FIG. 5(b).

In the example shown in FIG. 5(d) a general phase encoding magnetic field is used to obtain a flow sensitivity. Although this is simplest, it is difficult to obtain the encoding quantity same as that of FIG. 5(a).

Figure 5E:
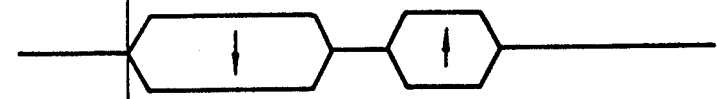

FIG. 5(e) shows an improved version of FIG. 5(d). This allows the encoding quantity same as that of FIG. 5(a) while obtaining a flow sensitivity.

Figure 5F:

FIG. 5(f) shows another improved version. In this example, the front and tail of the bipolar phase encoding magnetic field shown in FIG. 5(a) are shorted by the same time duration to obtain a flow sensitivity. The front and tail may be elongated otherwise.

The examples shown in FIGS. 5(d) to 5(f) change their sensitivities at each phase encoding so that artifacts are likely to occur in some degree.

Figure 1:
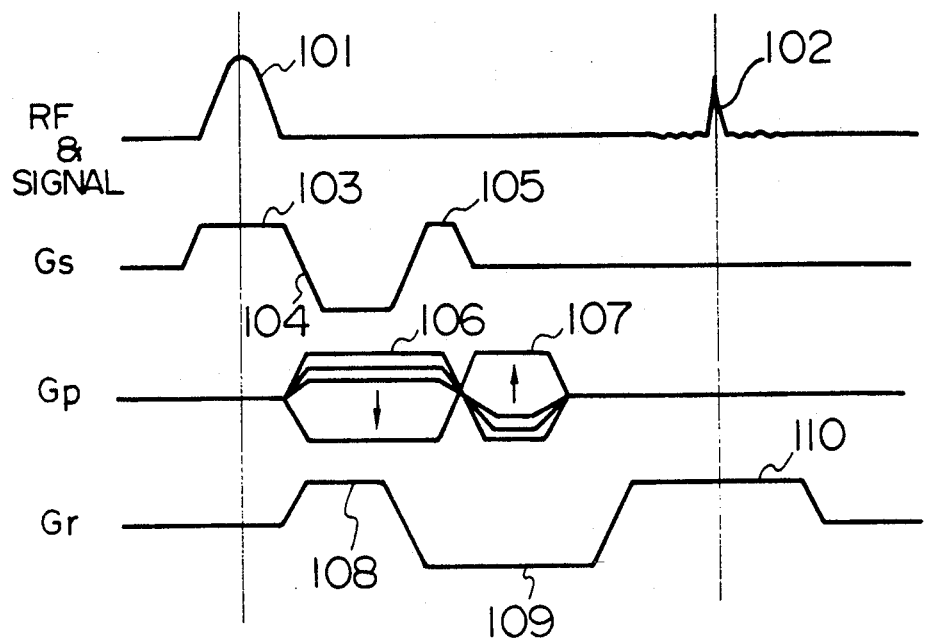
FIG. 1 shows an example of a phase insensitive sequence according to the present invention.
Figure 2:
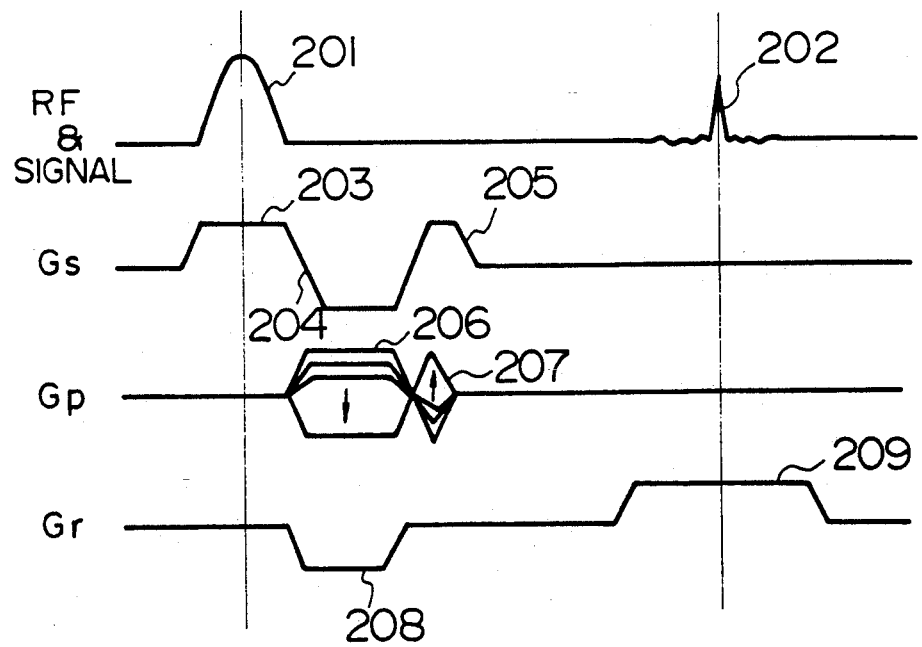
FIG. 2 shows an example of a phase sensitive sequence according to the present invention.

Shown in FIGS. 1 and 2 is an example of angiosequences using the phase insensitive and sensitive encoding magnetic fields of FIGS. 5(a) and 5(f). In this example, there is a difference between the sequences in the Gp and Gr directions but not in the Gs direction. Images are reproduced from signals 102 and 202 measured by using such two types of sequences, and subtracted each other to obtain vascular images.

Next, the description will be given regarding the stationary area signal suppressing method.

Applying a dephasing magnetic field (gradient magnetic field) is equivalent to generating the 0-th order moment. If the 0-th order moment is allowed to generate without any particular device, the first order moment will generate at the same time, resulting in some drawback in angiography. A dephasing magnetic field suitable for angiography should suffice the conditions of:

$$M_0 \neq 0, \ M_1 = 0 \qquad (5)$$

Consider now a dephasing magnetic field composed of three magnetic fields in the slice direction such as shown in FIG. 7, which magnetic field suffices the condition of:

$$M_0 = 0, \ M_1 = 0$$

In this case, if $t_{S1}$ 701 and $t_{S2}$ 702 are changed at the same time, it is possible to change $M_0$ as desired while maintaining $M_1$ zero. The values $t_{S1}$ and $t_{S2}$ can be determined in general by solving a quadratic equation. Assuming that $t_0 = 2$ msec and the rise and fall times are 1 msec and a dephasing magnetic field of dt msec is used, the values $t_{S1}$ and $t_{S2}$ are obtained from:

$$t_{S2} = \{(11-2dt) \ sqrt \\ ((11-2dt)^2 + 4(6.5-dt)^2 - 440/3)\}/2 \qquad (6)$$

$$t_{S1} = (t_{S2} - dt + 4.5)$$

The dephasing magnetic field in the Gs direction shown in FIGS. 1 and 2 has a time period dt of 1 msec.

Next, the description will be given regarding the phase compensation method.

The phase distortions which poses some problem include mainly the phase distortion caused by eddy currents, and the phase distortion caused by a static magnetic field distortion which is incorporated during imaging with inverted magnetic fields through gradient echos.

These distortions are generally gentle, whereas the phase change of blood flow within vessels is rapid. Therefore, the phase distortion exclusive of that associated with the phase change in vessels can be estimated (refer to FIG. 8) from the phases of images reproduced only by using the low frequency components of the measured signals. The phase compensation of the images is thereby carried out by using the estimated phase distortion, and the phase-compensated images in the form of complex numbers are subtracted each other to accordingly obtain a high-quality vascular image.

The takeup size of low frequency data is preferably as small as possible so long as the phase distortion can be estimated, because the phase distortion associated with the phase change in vessels should preferably be excluded. The phase distortion caused by a static magnetic field distortion is proportional in amount to the time duration (echo time TE) from excitation to measurement. It is therefore preferable to make smaller the takeup size of low frequency data as the period TE becomes shorter. In taking up low frequency data, ringings should be filtered to obtain an image of higher quality.

Lastly, separation between arteries and veins will be described.

Both arteries and veins within a body run generally along the body axis, in opposite directions by 180 degrees. On the basis of this principle, arteries and veins can be discriminated by confirming the opposite polarities of phases at the vascular areas. In this case, it is necessary to use not absolute values but complex numbers in obtaining the phase at the vascular area during the subtraction. Also in this case, the previously discussed phase compensation should be carried out without merely performing the subtraction, to thereby obtain the phase properly and thus separate arteries from veins or vice versa.

A particular embodiment of this invention will now be described in the following.

Figure 3:
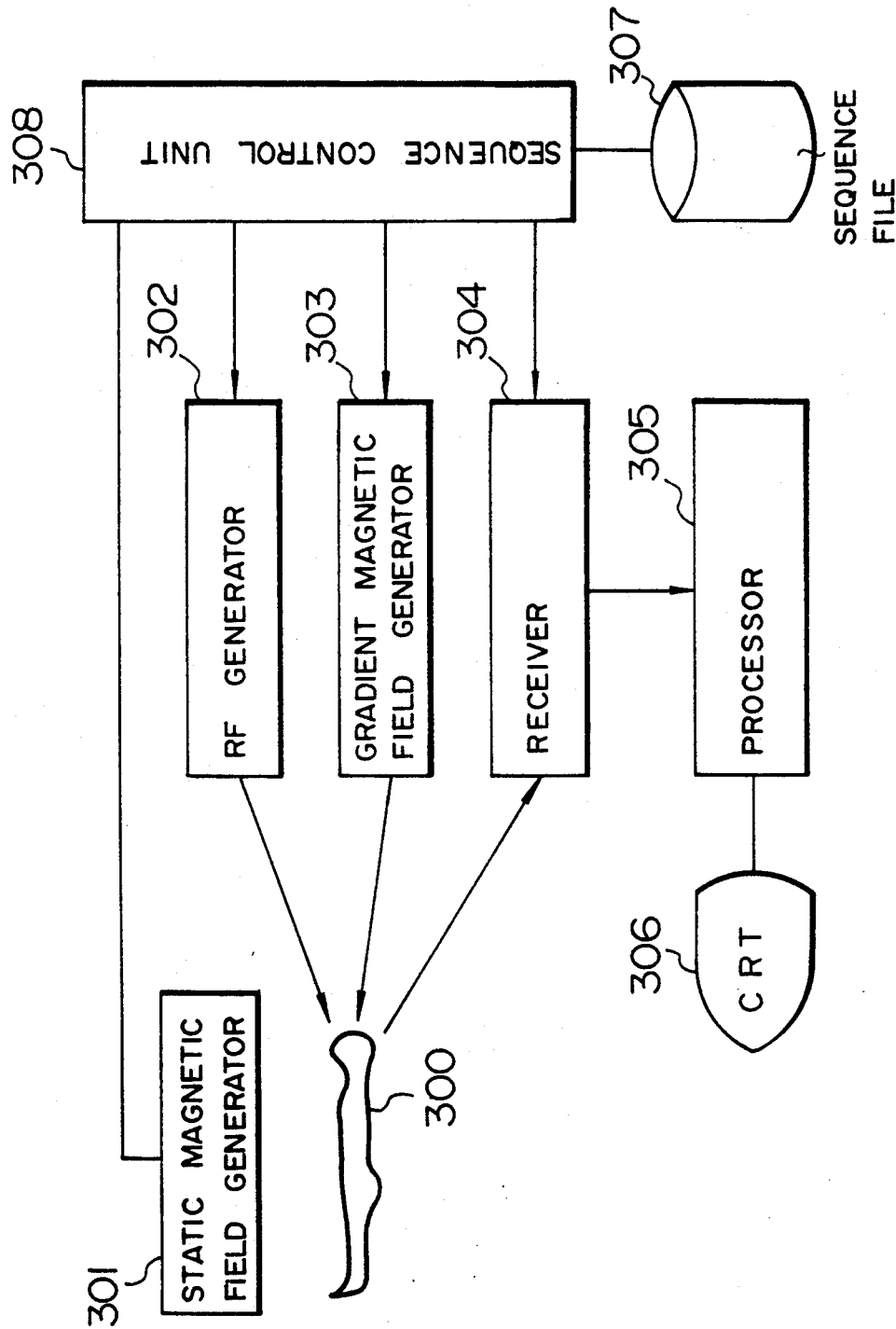
FIG. 3 is a block diagram showing an embodiment of a magnetic resonance imaging apparatus according to the present invention.

FIG. 3 is a block diagram showing the outline of the structure of a magnetic resonance imaging (MRI) apparatus according to the embodiment of this invention. In FIG. 3, a static magnetic field generator 301 generates a uniform and static magnetic field. An RF generator generates a radio frequency magnetic field which excites spins. A gradient magnetic field generator 303 generates a magnetic field while linearly changing the intensity independently of the x-, y-, and z-directions. A receiver 304 receives, rectifies and A/D converts an electromagnetic wave from an object to be imaged. A processor 305 processes the data measured by the receiver and performs various calculations necessary for image reproduction. A CRT 306 displays thereon the reproduced results. A pulse sequence file 307 stores therein control procedures for the above described components. A sequence control unit 308 controls the operation timings of the components in accordance with the control procedures stored in the pulse sequence file.

An example of pulse sequences embodying the present invention is shown in FIGS. 1 and 2. FIG. 1 shows an example of a phase insensitive sequence, and FIG. 2 shows an example of a phase sensitive sequence. In FIGS. 1 and 2, the rise and fall or gradient magnetic fields are also depicted.

In the slice direction, a dephasing magnetic field is applied which generates the 0-th moment while making zero the first order moment. The application timings ts1 and ts2 (FIG. 7) of the dephasing magnetic field having a duration of dt are obtained from the equation (6). The dephasing magnetic fields used in the sequences shown in FIGS. 1 and 2 have a 1 msec duration dt. The example shown in the equation (6) assumes that the dephasing magnetic field is applied 2 msec after the center of RF. Obviously, the dephasing magnetic field may be applied at any time. If dt is 0, the magnetic field applied in the slice direction becomes an ordinary phase insensitive magnetic field.

Figure 4A:
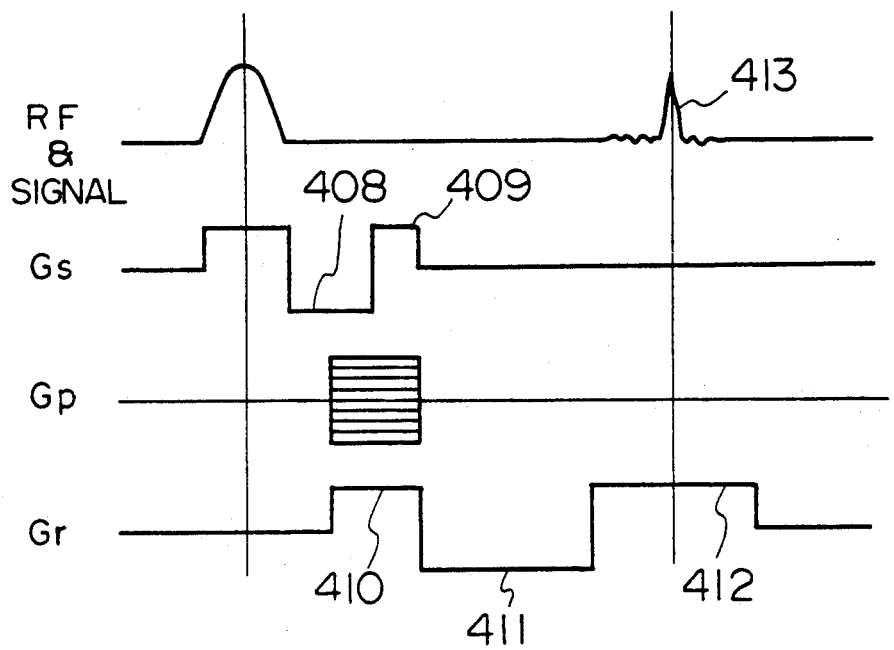
FIGS. 4A and 4B show examples of conventional phase insensitive and sensitive sequences.
Figure 4B:
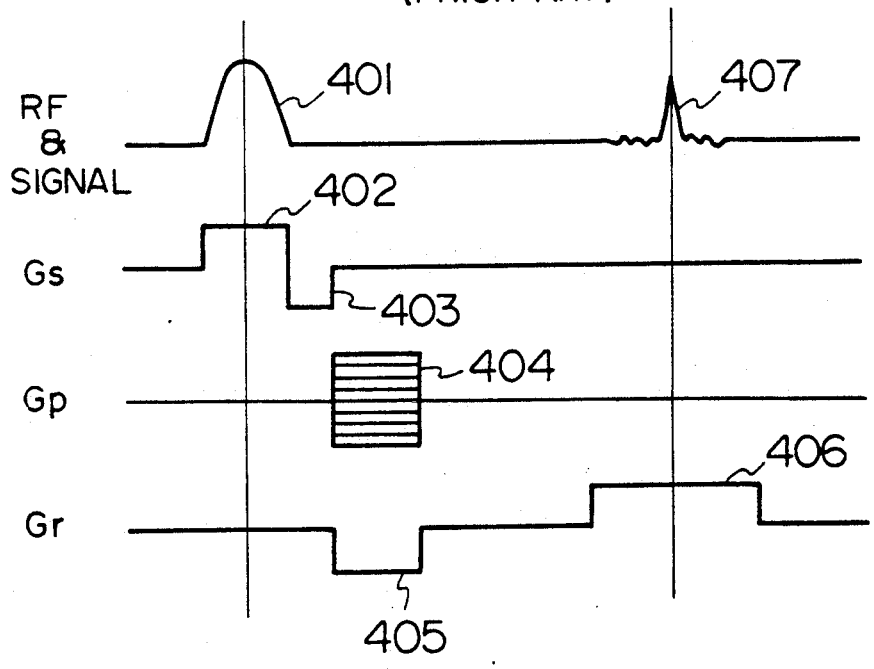

In the phase encoding direction, there are used the phase insensitive sequence shown in FIG. 5(a) and phase sensitive sequence shown in FIG. 5(f). Instead of the sequence of FIG. 5(f), any one of the sequences of FIGS. 5(b) to 5(e) may be used. The duration of the magnetic field changes depending on the application timing, as in the case of the dephasing magnetic field. In the readout direction, the ordinary phase insensitive and sensitive magnetic fields similar to FIGS. 4A and 4B are applied.

In a so-called cineangio-cardiography wherein the moving image of a heart is displayed in synchro with a cardiogram by measuring signals at each cardiac cycle, the signals from the vascular areas should be enhanced. In such a case, the above-described phase insensitive sequence may be used in order to obtain images of high quality.

Examples of two-dimensional angiographic sequences have been described above. Next, three-dimensional imaging will be described. Since phase sensitive sequences can be obtained by modifying phase insensitive sequences as in the case of two-dimensional imaging, the following description is directed only to phase insensitive sequences.

Figure 9:
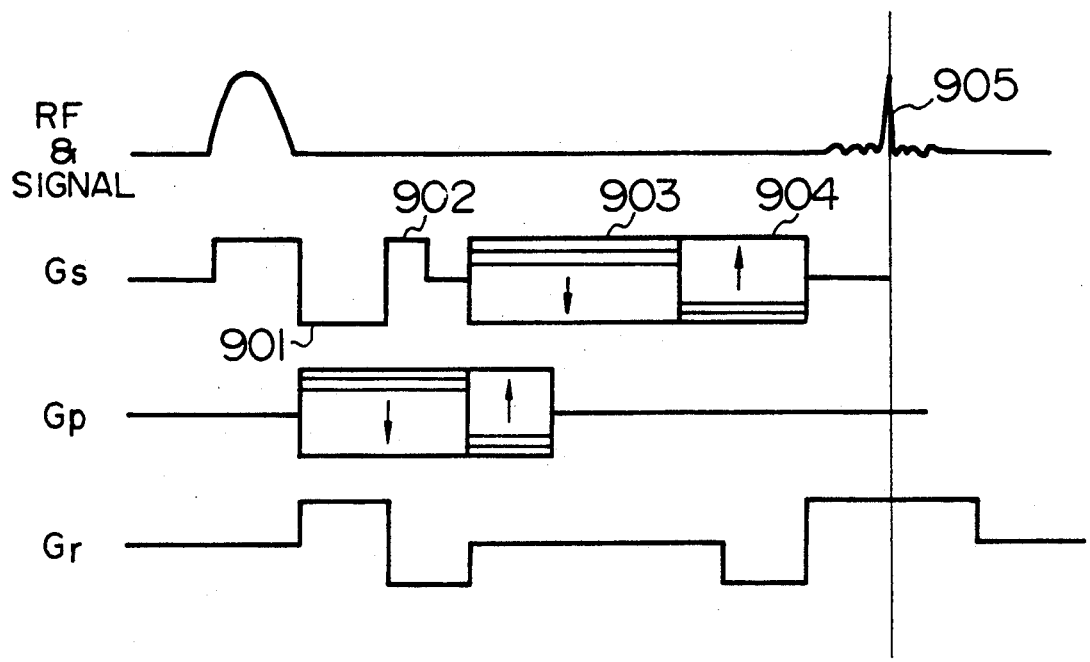
FIG. 9 is a timing chart illustrating the phase insensitive sequence for three-dimensional imaging.
Figure 10:
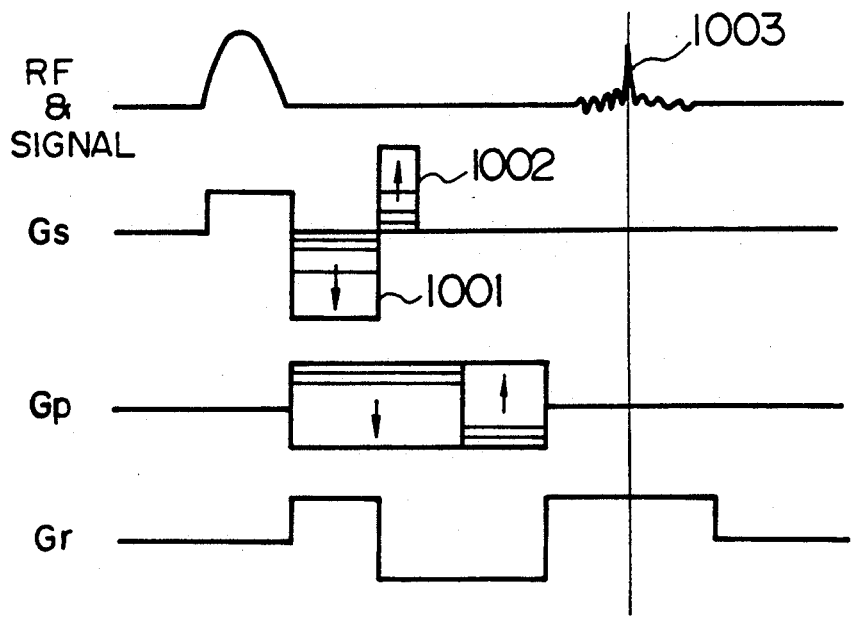
FIG. 10 is a timing chart illustrating a modification of the phase insensitive sequence for three-dimensional imaging shown in FIG. 9.

Different points from two-dimensional imaging are that a dephase is not carried out in the slice direction and that it becomes necessary to apply an additional phase encoding magnetic field for separation of a slice direction. Examples of sequences are shown in FIGS. 9 and 10. The difference between two sequences is whether or not the phase insensitive compensation magnetic fields are designed so as to superpose one upon another in the phase encoding and slice directions. In FIG. 9, additional phase encoding magnetic fields 903 and 904 are applied in addition to the compensation magnetic fields. There arises a drawback that the echo time at which a signal 905 is measured, becomes long. In FIG. 10, the magnetic fields 1001 and 1002 are composed of the phase compensation magnetic fields same as those 901 and 902 and the phase encoding magnetic fields. In this case, although the echo time does not become long, the maximum intensity of the magnetic fields 1001 and 1002 becomes large, so that if the intensity is not allowed to make large, the phase encoding quantity should be reduced, resulting in a low resolution in the slice direction. The examples shown in FIGS. 9 and 10 have both merit and demerit as described above. If the gradient magnetic field intensity is allowed to set large, the example shown in FIG. 10 is preferable because of a shorter echo time.

Three-dimensional angiographic imaging of vascular areas can thus be realized by using the above-described three-dimensional phase insensitive sequences and their modified-version phase sensitive sequences. Further, angiographic imaging without subtraction can be realized by enhancing signals from vascular areas by using the phase insensitive sequence and by suppressing signals from stationary areas. This method is called a Time-of-Flight method.

Since the phase insensitive sequence has a function to enhance signals from vascular areas, it may be effectively applied to methods other than angiography.

Figure 11:
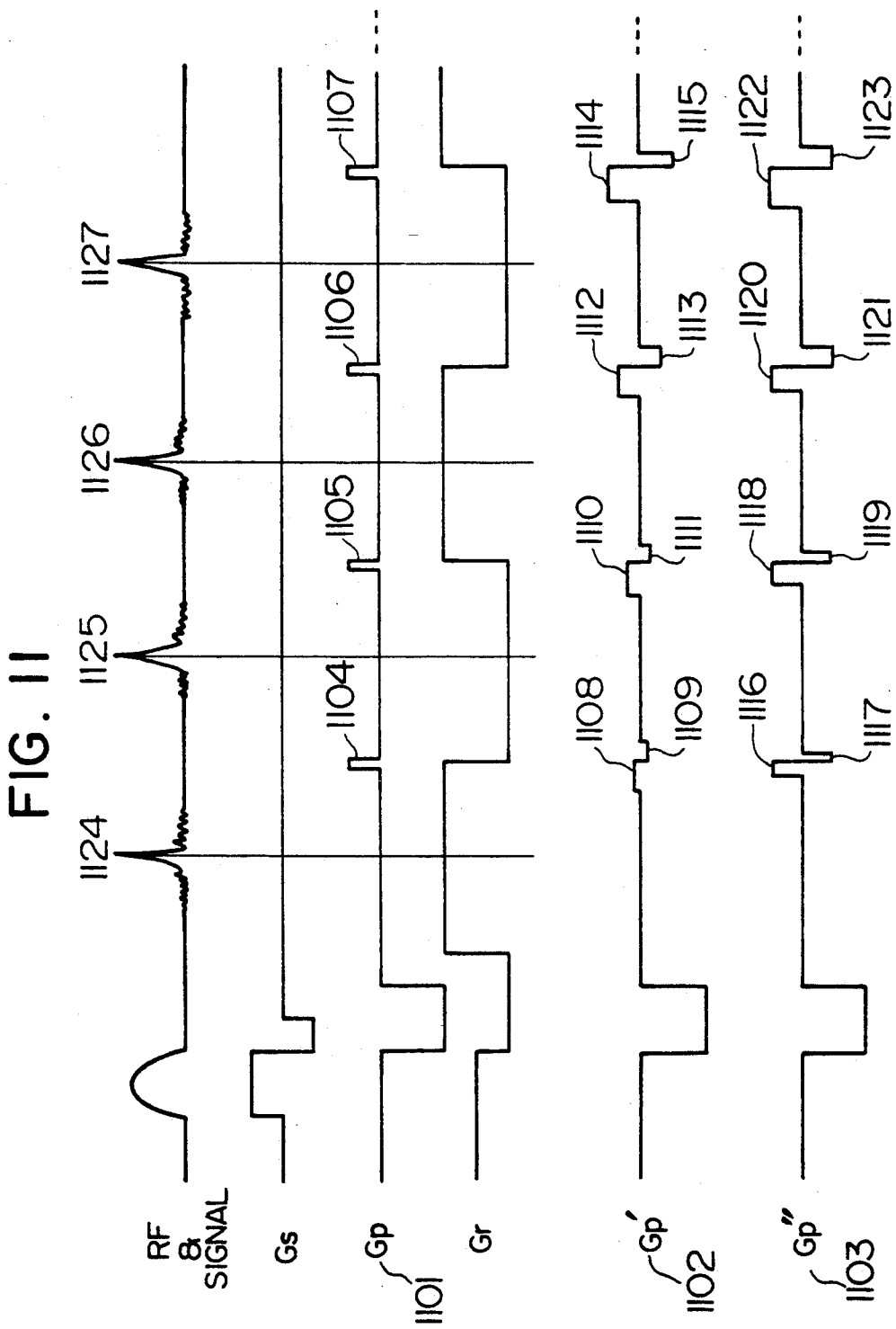
FIG. 11 is a timing chart illustrating an example of the phase insensitive sequence for very high speed imaging, and its modifications.

If the phase insensitive sequence is used in very high speed imaging wherein a plurality of phase encoding magnetic fields are used at a time to measure a plurality of signals, it is to be noted that a different shape of each bipolar phase encoding pulse should be used for the compensation of the first order moment of each phase encoding magnetic field. If the very high speed imaging is not used, the phase encoding pulses are applied always at the same timing relative to the RF pulse so that the shape of the bipolar phase encoding pulse is always the same. However, if the very high speed imaging is used, the phase encoding pulses are applied at different timings relative to the RF pulse so that the shape of the bipolar phase encoding pulse becomes different. FIG. 11 shows typical examples of very high speed sequences. The phase encoding magnetic field sequence 1101 shows an ordinary method of applying magnetic fields. In this case, the phase encoding pulses 1104 to 1107 (the number of which changes with the type of imaging) having the same intensity are applied. According to the present invention, the phase insensitive sequences Gp' 1102 and Gp" 1103 are used. For the sequence Gp' 1102, pairs of 1108 and 1109, 1110 and 1111, 1112 and 113, and 114 and 115 are sequentially applied while time sequentially increasing the intensity thereof to cancel the increasing first order moment. For the sequence Gp" 1103, pairs of 1116 and 1117, 1118 and 1119, 120 and 1121, and 1122 and 1123 are sequentially applied while time sequentially increasing the duration thereof instead of the intensity. In both sequences Gp' 1102 and Gp" 1103, the difference between bipolar magnetic fields for each pair is the same as that in the sequence Gp 1101. In other words, the 0-th order moment of the phase encoding pulse is the same for all the sequences Gp 1101, Gp' 1102 and Gp" 1103.

Figure 12:
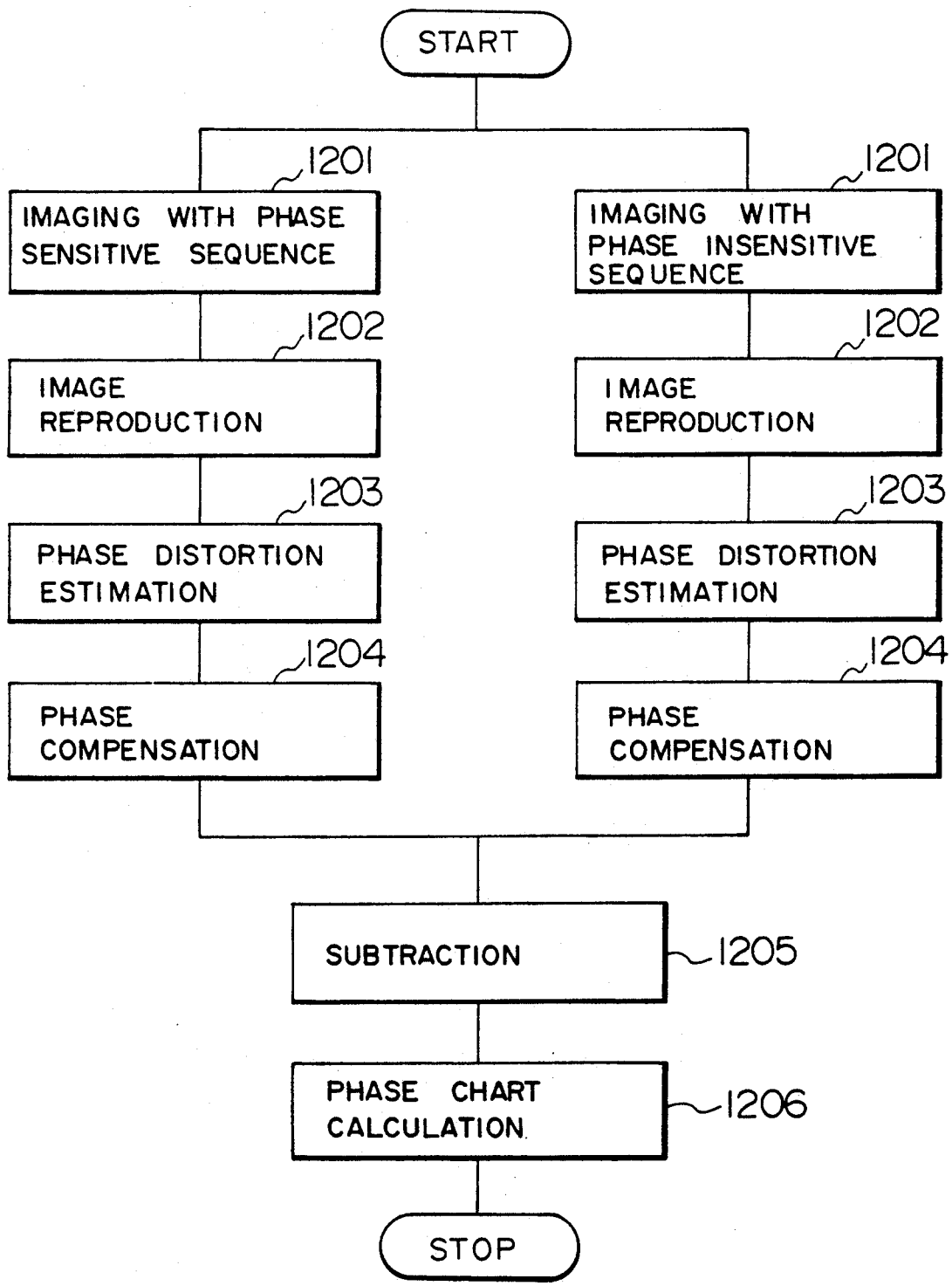
FIG. 12 is a flow chart showing the procedure of a magnetic resonance imaging method.

Next, the sequential procedure starting from signal measurement to image reproduction will be described with reference to FIG. 12 for the angiography using a subtraction method.

Step 1201: Angiographic imaging is carried out using the phase insensitive and sensitive sequences. Examples of the sequences are shown in FIGS. 1 and 2 for two-dimensional imaging, in FIGS. 9 and 10 for three-dimensional imaging, and in FIG. 11 for very high speed imaging.

Step 1202: Image data for the sequences are subjected to two-dimensional Fourier transformation to reproduce images.

Step 1203: The phase distortions are estimated from the measured data. This estimation procedure will be later described in detail with reference to FIGS. 13 and 14.

Step 1204: Image pixels are corrected in accordance with the amount of the estimated phase distortion.

Step 1205: The images obtained by the phase insensitive and sensitive sequences are subtracted each other by using complex numbers, and the absolute values are used to obtain a vascular image.

Step 1206: The phase values of the complex subtraction results obtained at Step 1205 are calculated to obtain a phase chart of the vascular image. The arteries and veins can be discriminated on the basis of the negative/ positive sign of the phase values. The display method of this will be described later.

Next, the method of calculating a phase distortion in the two-dimensional imaging will be described with reference to FIG. 13.

Step 1301: The central part of measured data is taken up. This central part corresponds to the low frequency components of the image. The shape of takeup area may be rectangular. In taking up low frequency data, it is preferable to use a filter to avoid ringings generated in the image and hence obtain the image of high quality. It is necessary to make larger the takeup size as the echo time becomes longer. However, this is not always the case because the takeup size depends on a non-uniformity of the static magnetic field. For the image size of 256×256, this size may be about 48×48.

Step 1302: The data obtained at Step 1301 are subjected to a two-dimensional Fourier transformation, and the phase chart is obtained from the resultant image. This phase chart provides the estimated values of phase distortions.

Next, the description will be made with reference to FIGS. 14(a) to 14(d) showing the three-dimensional imaging which has various modifications as different from the two-dimensional imaging.

The modification shown in FIG. 14(a) is a direct application of the two-dimensional imaging shown in FIG. 13 to the three-dimensional imaging. The modification of FIG. 14(a) includes two steps similar to FIG. 13.

In the modification shown in FIG. 14(b), first three-dimensional data are subjected to a one-dimensional Fourier transformation in the slice direction. The Fourier-transformed data become two-dimensional data so that the same procedure as FIG. 13 can be applied.

Step 1401(b): Three-dimensional data are subjected to a one-dimensional Fourier transformation in the slice direction to obtain two-dimensional data.

Step 1402(b): The central part low frequency data are taken up for each slice in the similar manner to Step 1301.

Step 1403(b): The phase distortion is estimated for each slice in the similar manner to Step 1302.

In the modification shown in FIG. 14(c), for the estimated values of phase distortions, the phase chart of the three-dimensional image at any one slice is used. This modification is based on the fact that the thickness of slice is usually 1.2 mm so that the phase distortion at one slice is similar to that at a nearby slice. It is obvious that a plurality of images at different slices may be used to estimate the phase distortions.

In the modification shown in FIG. 14(d), image data at each slice are accumulated to obtain projection data which are then used to estimate the phase distortions. In this modification, the phases of an averaged image are used to correct the image. Instead of accumulation, the phases of an image may be used which image has been obtained from the measured data in the slice direction without application of the phase encoding magnetic field.

Lastly, the display method will be given. As previously described, the flow direction in arteries and veins are generally opposite so that they can be discriminated on the basis of the negative/positive sign of the phase angle. The display method for discriminated images is as in the following.

Figure 15A:
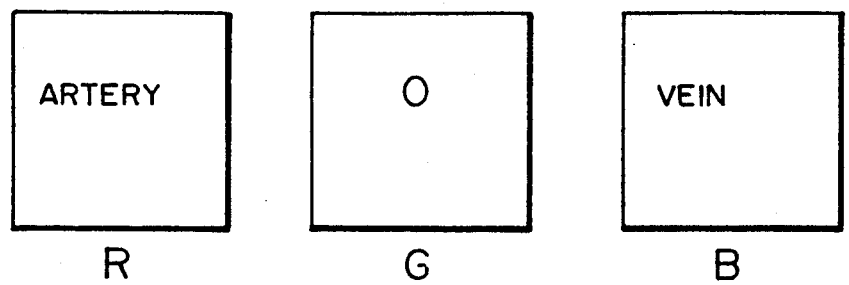
FIGS. 15(a) and 15(b) are conceptual diagrams illustrating a color display of arteries and veins separated by using three image memories.
Figure 15B:
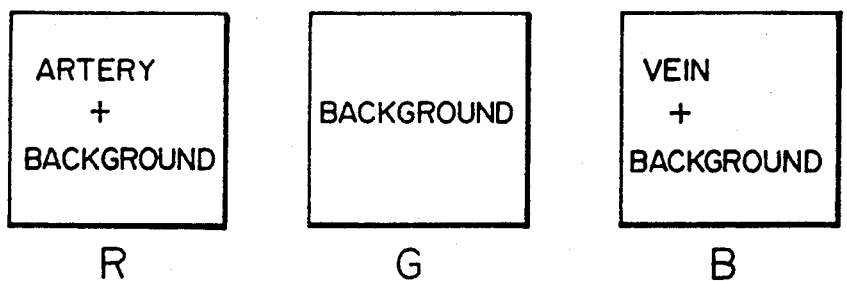

FIGS. 15(a) and 15(b) illustrate a color display using three image memories to which red (R), green (G) and blue (B) are allocated. For example, as shown in FIG. 15(a), if red is allocated to an artery, blue to a vein, and green to a zero (blank), then the artery and vein are colored with red and blue, respectively. As shown in FIG. 15(b), if the image obtained by the phase sensitive sequence without the vascular area is used as the background, and red is allocated to the background and artery, blue to the background and vein, and the background to green, then the artery is colored with red in the monochrome background, and the vein is with blue in the monochrome background.

Figure 16A:
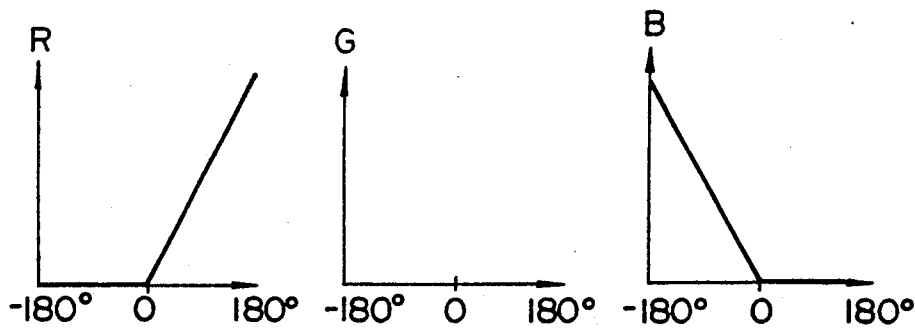
FIGS. 16(a) and 16(b) are conceptual diagrams illustrating a color display of arteries and veins separated by using a single image memory and a look-up table.
Figure 16B:
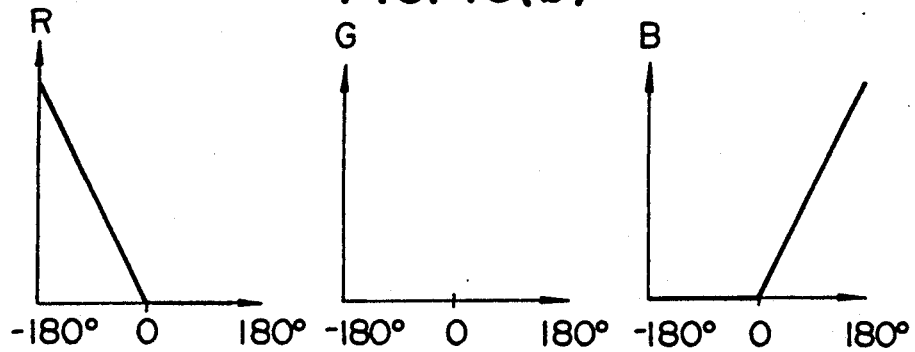

Instead of using three image memories, a pseudo color display is possible by using a single image memory and a look-up table (LUT) by setting in the image memory the phase chart of a vascular area. FIGS. 16(a) and 16(b) illustrate an example of setting an LUT. FIG. 16(a) illustrates that the phase positive direction corresponds to an artery and the phase negative direction to a vein, whereas FIG. 16(b) illustrate the reversed case. In FIG. 16(a), as the phase angle becomes more positive, the density of red increases more, and as it becomes more negative, the density of blue increases more. Therefore, the artery is colored with red, and the vein is colored with blue.

According to the present invention, the following advantages can be obtained.

(1) (a) The phase insensitive sequence in the phase encoding direction can be expressed by a minimum number of pulses. Therefore, the echo time from spin excitation to echo measurement can be minimized so that signals from the vascular area can be enhanced. Such sequence is applicable not only to ordinary two-dimensional imaging but also to three-dimensional imaging and very high speed imaging.

(b) A dephasing magnetic field is applied which generates the 0-th order moment without generating the first order moment in the slice direction. Therefore, unnecessary signals from other than vascular areas can be suppressed so that signals can be measured with a larger dynamic range.

(c) The phase of a reproduced image can be corrected using only measured signals. Therefore, a high quality image with its phase corrected at vascular areas can be obtained without performing insensitive measurement and calculations.

(d) Using the phase information, arteries and veins can be discriminated and displayed, while coloring the arteries with red and the veins with blue, for example. Therefore, angiographic images suitable for diagnosis by doctors can be provided without invasion.

We claim:

1. A magnetic resonance imaging method for a moving object comprising the steps of:

exciting spins within a particular area of an object to be detected;

applying a bipolar phase encoding magnetic field including a phase encoding magnetic field for giving the spins a phase shift and an inverted phase encoding magnetic field having an inverted polarity and a same amplitude of the phase encoding magnetic field, the inverted phase encoding magnetic field being applied after the phase encoding magnetic field;

measuring a one-dimensional echo signal while applying a readout gradient magnetic field;

measuring a two-dimensional echo signal by repeating the step of exciting to the step of measuring the one-dimensional echo signal while applying the bipolar phase encoding magnetic field such that at least one of the amplitude and application time of the bipolar phase magnetic field is changed at each application so as to generate a desired encoding quantity and to make the first order moment of a gradient magnetic field generated by the bipolar phase encoding magnetic field zero; and reproducing an image by using the measured two-dimensional echo signal.

2. A method according to claim 1, wherein the generation of the desired encoding quantity includes a step of generating the first order moment by making application times of the phase encoding magnetic field and application times of the inverted phase encoding magnetic field shorter or longer by the same amount, after making the first order moment zero.

3. A method according to claim 1, wherein the step of applying the bipolar phase encoding magnetic field is carried out a plurality of times after performing the step of exciting spins once.

4. A method according to claim 3, wherein the step of applying the bipolar phase encoding magnetic field is effected two times so as to enable processing of a three-dimensional imaging.

5. A method according to claim 3, wherein the step of measuring the one-dimensional echo signal is effected each time the bipolar phase encoding magnetic field is applied.

6. A method according to claim 5, wherein the step of measuring the two-dimensional echo signal includes changing the amplitude of the bipolar phase encoding magnetic field at each application of the bipolar phase encoding magnetic field after performing the step of exciting spins once.

7. A method according to claim 6, wherein the changine of at least one of the amplitude and application time of the bipolar phase encoding magnetic field includes changing the amplitude by setting a value of the amplitude so as to make an increase of the amplitude a monotonic increasing function.

8. A method according to claim 5, wherein the step of measuring the two-dimensional echo signal includes changing the application time of the bipolar phase encoding magnetic field at each application of the bipolar phase encoding magnetic field after performing the step of exciting spins once.

9. A method according to claim 8, wherein the changing of the application time of the bipolar phase encoding magnetic field includes setting the application time so as to make an increase of the application time a monotonic increasing function.

* * * * *